(12) United States Patent
Huang et al.

(10) Patent No.: US 9,197,195 B2
(45) Date of Patent: *Nov. 24, 2015

(54) DRIVERS HAVING T-COIL STRUCTURES

(71) Applicant: TAIWAN SEMICONDUCTOR MANUFACTURING COMPANY, LTD., Hsinchu (TW)

(72) Inventors: Ming-Chieh Huang, San Jose, CA (US); Tao Wen Chung, San Jose, CA (US); Chan-Hong Chern, Palo Alto, CA (US); Chih-Chang Lin, San Jose, CA (US); Yuwen Swei, Fremont, CA (US); Chiang Pu, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/520,646

(22) Filed: Oct. 22, 2014

(65) Prior Publication Data

US 2015/0035566 A1 Feb. 5, 2015

Related U.S. Application Data

(63) Continuation of application No. 13/278,742, filed on Oct. 21, 2011, now Pat. No. 8,896,352.

(51) Int. Cl.
*H03K 3/00* (2006.01)
*H03H 11/44* (2006.01)
*H04B 10/50* (2013.01)
*H01S 5/042* (2006.01)

(52) U.S. Cl.
CPC ............. *H03H 11/44* (2013.01); *H04B 10/504* (2013.01); *H01S 5/0427* (2013.01)

(58) Field of Classification Search
CPC ..... H03H 11/44; H04B 10/504; H01S 5/0427
USPC .................................................. 327/108, 110
See application file for complete search history.

(56) References Cited

U.S. PATENT DOCUMENTS

| | | | |
|---|---|---|---|
| 6,366,166 B1 * | 4/2002 | Belot | 330/252 |
| 6,756,849 B2 * | 6/2004 | Dupuis et al. | 330/279 |
| 6,985,036 B2 | 1/2006 | Bhattacharjee et al. | |
| 7,064,605 B2 * | 6/2006 | Westwick et al. | 330/85 |
| 7,463,112 B1 | 12/2008 | Groves | |

(Continued)

FOREIGN PATENT DOCUMENTS

CN            1612341        5/2005
WO    WO 2007/069060 A2 *   6/2007

OTHER PUBLICATIONS

Galal, Sherif et al., "10-Gb/s Limiting Amplifier and Laser/Modulator Driver in 0.18-μm CMOS Technology", IEEE Journal of Solid-State Circuits, vol. 38, No. 12, Dec. 2003, pp. 2138-2146.

*Primary Examiner* — Kenneth B Wells
(74) *Attorney, Agent, or Firm* — Hauptman Ham, LLP

(57) ABSTRACT

A driver includes a first driver stage having a first T-coil structure. The first T-coil structure includes a first set of inductors each being operable to provide a first inductance. The first T-coil structure further includes a second set of inductors electrically coupled with the first set of inductors, wherein the second set of inductors each are operable to provide a second inductance.

20 Claims, 4 Drawing Sheets

(56) References Cited

U.S. PATENT DOCUMENTS

| | | | |
|---|---|---|---|
| 7,636,003 B2* | 12/2009 | Liu et al. | 327/307 |
| 7,961,051 B2* | 6/2011 | Jonsson et al. | 330/305 |
| 8,270,846 B2* | 9/2012 | Tsunoda | 398/182 |
| 8,451,058 B2* | 5/2013 | Cui et al. | 330/277 |
| 8,593,207 B2 | 11/2013 | Liu et al. | |
| 8,717,723 B2 | 5/2014 | Kireev et al. | |
| 8,896,352 B2* | 11/2014 | Huang et al. | 327/108 |

* cited by examiner

DRIVERS HAVING T-COIL STRUCTURES

PRIORITY CLAIM

The present application is a continuation of U.S. application Ser. No. 13/278,742, filed Oct. 21, 2011, now U.S. Pat. No. 8,896,352, the disclosure of which is incorporated herein by reference in its entirety.

TECHNICAL FIELD

The present disclosure relates generally to the field of semiconductor integrated circuits, and more particularly to drivers having a T-coil structure.

BACKGROUND

An optical link is a link that is communicated through an optical fiber. With advances in the communication technology, the bandwidth of an optical link has increased from several gigabytes per second (Gb/s) to tens of Gb/s. A transceiver on each end of the optical link is capable of transmitting and/or receiving the high bandwidth signals. In general, a driver is disposed at the transmission end, driving an optical source to achieve such high bandwidth signals.

BRIEF DESCRIPTION OF THE DRAWINGS

One or more aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
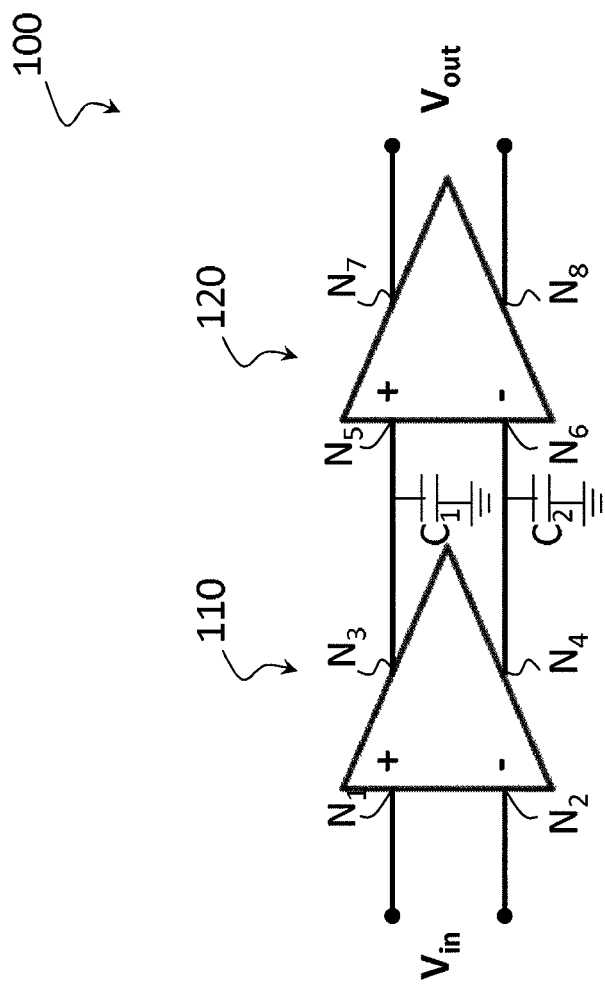
FIG. 1 is a schematic drawing of an exemplary driver.

A driver is made by 0.18-μm technology node. The driver has a T-coil on each output node of a driver stage for inductive peaking. The T-coil has two inductors both of which are electrically coupled to the output node. The inductors each provide an inductance of about 3 nanoheneries (nH) in response to parasitic capacitances seen by the output node of the driver stage.

In the course of integrated circuit (IC) evolution, the technology node moves to small geometry sizes. This scaling down process generally provides benefits by increasing production efficiency and lowering associated costs. In designing a laser/modulator driver with a technology node smaller than 40 nanometers (nm), Applicants found the parasitic capacitances between the driver stages decrease drastically. In response to the low parasitic capacitances, the inductor in the T-coil is designed with a small inductance, e.g., about 0.1 nH. Applicants also found the inductors, each of which generates the about 0.1 nH inductance, may not provide a coupling coefficient (k) of about 0.5 that is designed to increase the bandwidth of the driver.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples.

FIG. 1 is a schematic drawing of an exemplary driver. In FIG. 1, a driver 100 includes at least one driver stage, e.g., driver stages 110 and 120. The driver stages 110 and 120 are electrically coupled with each other. The driver stage 110 has at least one input node, e.g., input nodes $N_1$ and $N_2$, and at least one output node, e.g., output nodes $N_3$ and $N_4$. The driver stage 120 has at least one input node, e.g., input nodes $N_5$ and $N_6$, and at least one output node, e.g., output nodes $N_7$ and $N_8$. The output nodes $N_3$ and $N_4$ are electrically coupled with the input nodes $N_5$ and $N_6$, respectively.

In some embodiments, the driver 100 is a laser driver, a modulator driver or a driver of other types. The driver 100 is operable to receive an input signal $V_{in}$ and then provide an output signal $V_{out}$ to drive other circuitries, diodes, devices, etc. It is noted that the number of the driver stages shown in FIG. 1 is merely exemplary. In some embodiments, the driver 100 includes a single driver stage or more than two driver stages.

Referring to FIG. 1, capacitances of parasitic capacitors $C_1$ and $C_2$ exist between the driver stages 110 and 120. The capacitances of the parasitic capacitors $C_1$ and $C_2$ may affect the electrical operation of the driver 100 departing from its ideal condition. The capacitances of the parasitic capacitors $C_1$ and $C_2$ can, in some embodiments, be compensated to achieve a desired operation of the driver 100.

Figure 2:
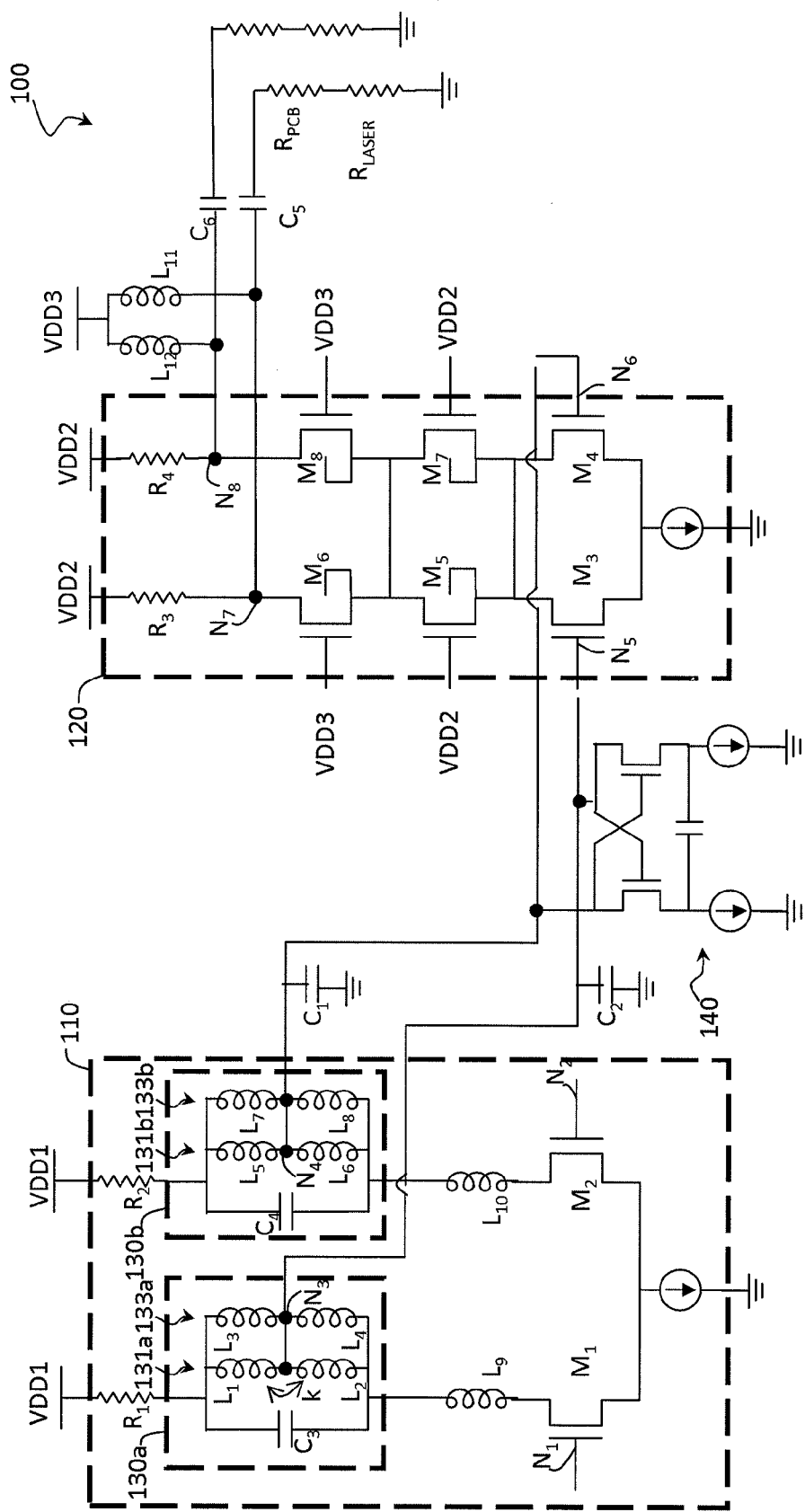
FIG. 2 is a schematic drawing of another exemplary driver having at least one T-coil structure.

FIG. 2 is a schematic drawing of another exemplary driver including at least one T-coil structure. In FIG. 2, the driver stage 100 includes transistors $M_1$ and $M_2$ whose gates are electrically coupled with the input nodes $N_1$ and $N_2$, respectively. Sources of the transistors $M_1$ and $M_2$ are electrically coupled with a current source. Drains of the transistors $M_1$ and $M_2$ are electrically coupled with T-coil structures 130a and 130b, respectively. Resistors $R_1$ and $R_2$ are electrically coupled between a power voltage level VDD1 and the respective T-coil structures 130a and 130b. In some embodiments, VDD1 is the same for $R_1$ and $R_2$. In other embodiments, VDD1 differs for $R_1$ and $R_2$.

In FIG. 2, the T-coil structures 130a and 130b are disposed adjacent to the output nodes $N_3$ and $N_4$, respectively. The T-coil structures 130a and 130b are operable to provide inductive peaking on the respective output nodes $N_3$ and $N_4$. In some embodiments, the T-coil structures 130a and 130b each include a plurality of sets of inductors, e.g., inductor sets 131a, 133a and 131b, 133b, respectively. The inductors set 131a is electrically coupled with the inductor set 133a in a parallel fashion. The inductor set 131b is electrically coupled with the inductor set 133b in a parallel fashion. In some embodiments, the inductor sets 131a, 133a, 131b and 133b include respective inductors $L_1$-$L_2$, $L_3$-$L_4$, $L_5$-$L_6$ and $L_7$-$L_8$.

In some embodiments, the output node $N_3$ is between the inductors $L_1$ and $L_2$ and between the inductors $L_3$ and $L_4$. In some embodiments, the output node $N_4$ is between the inductors $L_5$ and $L_6$ and between the inductors $L_7$ and $L_8$. In some embodiments, the inductor sets 131a and 133a are electrically coupled with a capacitor $C_3$ in a parallel fashion. In some embodiments, the inductor sets 131b and 133b are electrically coupled with a capacitor $C_4$ in a parallel fashion.

As the technology node shrinks to, for example, 40 nm or below, the capacitances of the parasitic capacitors $C_1$ and $C_2$ decrease drastically. Applicants found that the inductance from each T-coil structure should be designed around, e.g., 0.1 nH or less, in response to the low parasitic capacitances. Applicants found that the 0.1 nH T-coil structure having the single set of inductors may provide a coupling coefficient (k) of about 0.3 due to the narrow metal wires and/or less loops of routing of the inductors. As the conventional T-coil cannot provide the coupling coefficient of about 0.5, the bandwidth of the driver 100 is substantially reduced.

To maintain the coupling coefficient of about 0.5 for the driver designed with the 40-nm or below technology node, Applicants design the inductors $L_1$-$L_8$ to each have an inductance of about 0.2 nH or more. Each parallel pair of the inductors, e.g., inductors $L_1$ and $L_3$ are operable to provide an equivalent inductance of about 0.1 nH or less in response to the low capacitances of the parasitic capacitors $C_1$ and $C_2$. Inductors $L_1$-$L_8$ each have wide metal wires and/or more loops of routing sufficient to provide 0.2-nH inductance, therefore the inductors of each inductor set, e.g., $L_1$ and $L_2$, are operable to provide a coupling coefficient of about 0.5. In some embodiments, the coupling coefficient (k) ranges from about 0.45 to about 0.55. By using the T-coil structures 130a and 130b, the bandwidth of the driver 100 may reach 40 GHz or higher.

Figure 3A:
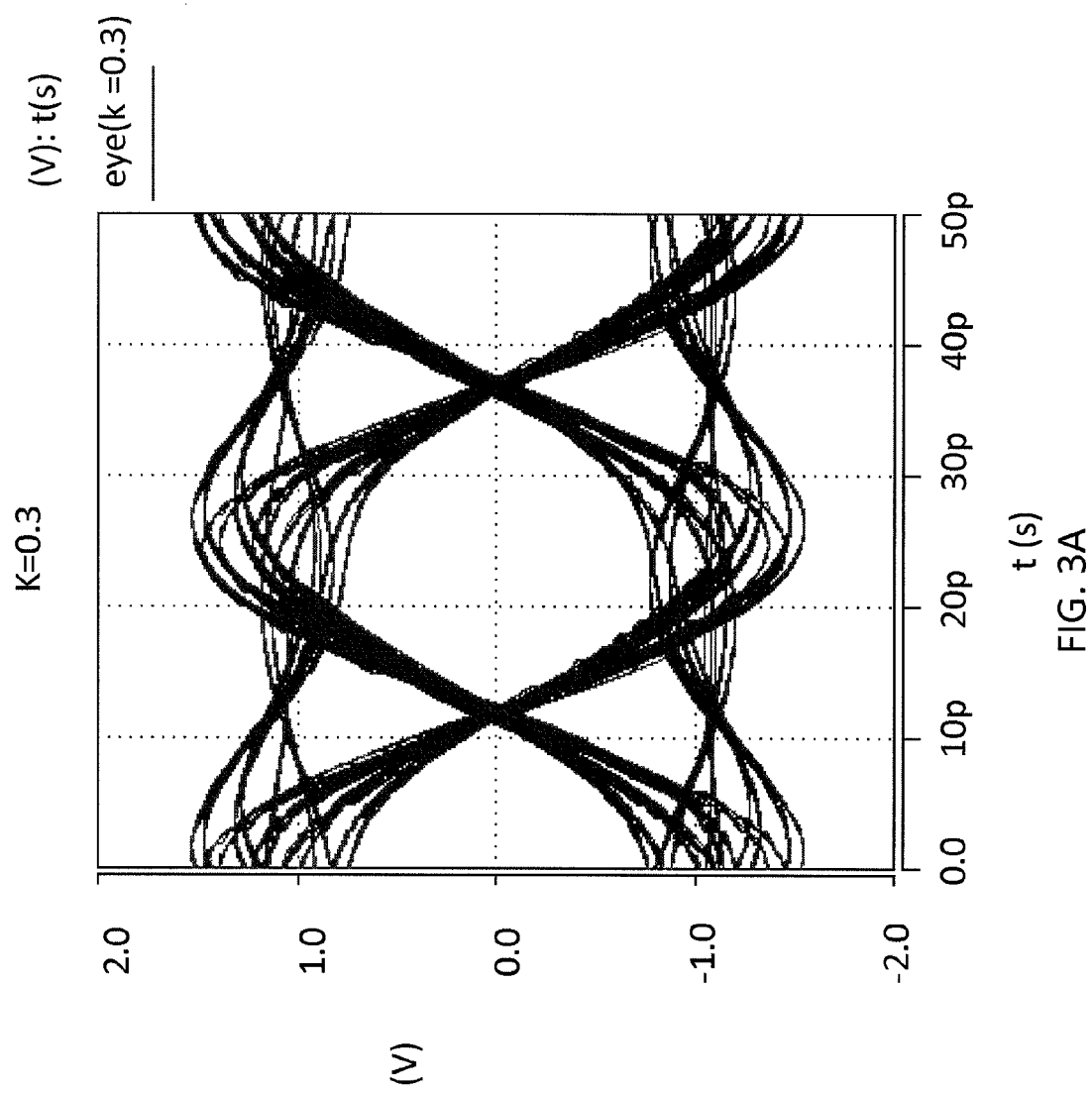
FIGS. 3A and 3B are schematic drawings showing simulation output results of an exemplary driver stage with different coupling coefficients (k).
Figure 3B:
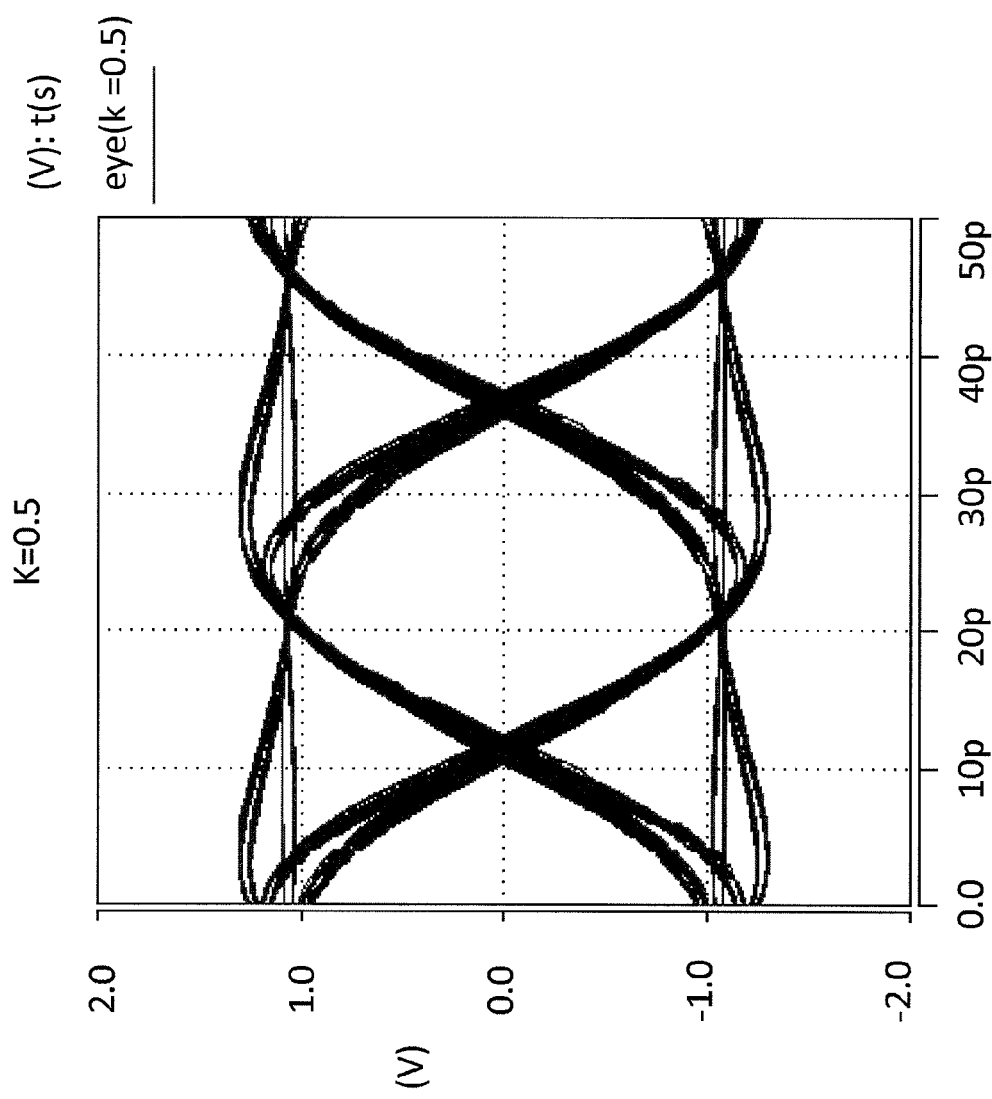

FIGS. 3A and 3B are schematic drawings showing simulation output results of an exemplary driver stage with different coupling coefficients (k). In FIGS. 3A and 3B, the vertical axis represents the voltage levels of the output signal and the horizontal axis represents time in the order of picoseconds (ps). For FIG. 3A, the coupling coefficient is about 0.3. For FIG. 3B, the coupling coefficient is about 0.5. As shown in the drawings, the eye pattern shown in FIG. 3B is more clear than that shown in FIG. 3A.

It is noted that the number of inductor sets and inductors described above in conjunction with FIG. 2 are merely exemplary. In some embodiments, the T-coil structures 130a and 130b each include more than two inductor sets to further lower the equivalent inductance. By lowering the equivalent inductance, a single inductor of each set of the inductors has a higher inductance. It is also noted that the inductance, the equivalent inductance and/or the bandwidth are merely exemplary. The inductance, the equivalent inductance and/or the bandwidth may be changed in response to the design of the driver.

In some embodiments, the driver stage 110 optionally includes inductors $L_9$ and $L_{10}$ that are electrically coupled between the transistors $M_1$ and $M_2$ and the T-coil structures 130a and 130b, respectively. The inductors $L_9$ and $L_{10}$ are operable to provide inductive peaking to the output nodes $N_3$ and $N_4$ and/or a shielding effect to the output nodes $N_3$ and $N_4$, respectively.

Referring again to FIG. 2, the driver stage 120 includes the input nodes $N_5$-$N_6$ and the output nodes $N_7$-$N_8$. The output nodes $N_7$ and Ng are electrically coupled with respective resistors $R_3$ and $R_4$, inductors $L_{11}$ and $L_{12}$ and capacitors $C_5$ and $C_6$. The capacitors $C_5$ and $C_6$ are electrically coupled with output loadings $R_{PCB}$ and/or $R_{LASER}$. In some embodiments, the output loading $R_{PCB}$ represents an equivalent resistance of a printed circuit board. The output loading $L_{LASER}$ represents an equivalent resistance of a laser diode. It is noted that the output loads shown in FIG. 2 are merely exemplary. In some embodiments, additional and/or different output loadings are electrically coupled with the output nodes $N_7$ and Ng of the driver stage 120.

In some embodiments, the driver stage 120 includes transistors $M_3$ and $M_4$ whose gates are electrically coupled with the input nodes $N_5$ and $N_6$, respectively. Sources of the transistors $M_3$ and $M_4$ are electrically coupled with a current source. Drains of the transistors $M_3$ and $M_4$ each are electrically coupled with at least one transistor, for example, transistors $M_5$-$M_6$ and $M_7$-$M_8$, respectively.

In some embodiments, the transistors $M_5$-$M_6$ and $M_7$-$M_8$ are disposed between the output node $N_7$ and the transistor $M_3$ and between the output node Ng and the transistor $M_4$, respectively. Gates of the transistors $M_5$-$M_6$ and $M_7$-$M_8$ are configured to receive a voltage level VDD2 or VDD3 for controlling on/off of the transistors $M_5$-$M_8$. In some embodiments, the voltage level VDD2 is the same as or different from the voltage level VDD3. In some embodiments, VDD2 is the same at $R_3$ and $R_4$. In some embodiments, VDD2 differs at $R_3$ and $R_4$. In some embodiments VDD3 is the same at $M_6$ and $M_8$. In some embodiments VDD3 differs at $M_6$ and $M_8$.

In some embodiments, the transistors $M_3$-$M_8$ are core devices. The term "core device" means that channel length of the transistor is designed with the minimum rule of the technology node. For example, if the technology node is 28 nm, the core device has a channel length of about 28 nm. Due to the small geometry of the core device, gate dielectric layers of the transistors $M_3$ and $M_4$ become thinner and are vulnerable to a high voltage differential applied thereon.

To protect the gate dielectric layer of the transistor $M_3$ from being damaged, the transistors $M_5$-$M_6$ are designed between the output node $N_7$ and the gate of the transistor $M_3$ to reduce a potential stress resulting from a voltage differential between node $N_7$ and gate of transistor $M_3$. For example, the output node $N_7$ may see a voltage variation of about 2V±1V and the gate of the transistor $M_3$ may see a voltage ranging from about 0.45V to about 0.85V. In a worst case scenario, the predicted voltage differential between the output node $N_7$ and the gate of the transistor $M_3$ reaches 2.55V. If the transistors $M_5$-$M_6$, each of which is operable to sustain a voltage drop of about 0.8V, were not used, the 2.55V voltage differential would damage the gate dielectric of the transistor $M_3$.

It is noted that the numbers of the transistors $M_5$-$M_6$ and $M_7$-$M_8$ are merely exemplary. The scope of this application is not limited thereto. For example, the numbers of the transistors $M_5$-$M_6$ and $M_7$-$M_8$ may be increased or decreased in response to the change of the technology node and/or voltage levels applied to the transistors. It is also noted that the voltage levels described above are merely exemplary. The voltage levels may be varied in response to, for example, the change of the technology node.

Referring again to FIG. 2, the driver 100 optionally includes a negative impedance converter 140 that is disposed between the driver stages 110 and 120. The negative impedance converter 140 is configured to provide a negative impedance to compensate the capacitances of the parasitic capacitors $C_1$ and $C_2$ that exist between the driver stages 110 and 120. In some embodiments when the capacitances of the parasitic capacitor $C_1$ and $C_2$ become small or tolerable, the negative impedance converter 140 is absent from drive 100.

In an exemplary embodiment of this application, a driver includes a first driver stage having at least one input node and at least one first output node. The first driver stage includes a T-coil structure that is disposed adjacent to the at least one first output node. The T-coil structure includes a first set of inductors each being operable to provide a first inductance. A second set of inductors are electrically coupled with the first set of inductors in a parallel fashion. The second set of inductors each are operable to provide a second inductance. A second driver stage is electrically coupled with the first driver stage.

One aspect of this description relates to a driver. The driver includes a first driver stage having a first T-coil structure. The first T-coil structure includes a first set of inductors each being operable to provide a first inductance. The first T-coil structure further includes a second set of inductors electrically coupled with the first set of inductors, wherein the second set of inductors each are operable to provide a second inductance.

Another aspect of this description relates to a driver. The driver includes a first driver stage having a first T-coil structure. The first T-coil structure includes a first set of inductors each being operable to provide an inductance of about 0.2 nanohenries (nH) or more and a coupling coefficient of about 0.5. The first T-coil structure includes a second set of inductors electrically coupled with the first set of inductors, wherein the second set of inductors each are operable to provide an inductance of about 0.2 nH or more.

Still another aspect of this description relates to a driver. The driver includes a first driver stage having T-coil structures. The T-coil structures each include a plurality of sets of inductors that are electrically coupled with each other, wherein each set of inductors of the plurality of sets of inductors is operable to provide a coupling coefficient of about 0.5.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A driver comprising:
    a first driver stage having a first T-coil structure, the first T-coil structure comprising:
        a first set of inductors each being operable to provide a first inductance; and
        a second set of inductors electrically coupled in parallel with the first set of inductors, wherein the second set of inductors each are operable to provide a second inductance.

2. The driver of claim 1, further comprising a capacitor connected in parallel with the first set of inductors and in parallel with the second set of inductors.

3. The driver of claim 1, further comprising a resistor, wherein a first end of the resistor is electrically connected to the first set of inductors and to the second set of inductors, and a second end of the resistor is configured to receive a power voltage.

4. The driver of claim 1, further comprising a transistor, wherein a first terminal of the transistor is electrically connected to the first set of inductors and to the second set of inductors, and a second terminal of the transistor is connected to a current source.

5. The driver of claim 4, further comprising an inductor between the transistor and both of the first set of inductors and the second set of inductors.

6. The driver of claim 1, further comprising a second driver stage electrically connected to the first driver stage, wherein an input node of the second driver stage is connected to a node between a first inductor of the first set of inductors and a second inductor of the first set of inductors.

7. The driver of claim 1, further comprising a second T-coil structure, the second T-coil structure comprising:
    a third set of inductors each being operable to provide a third inductance; and
    a fourth set of inductors electrically coupled with the third set of inductors, wherein the fourth set of inductors each are operable to provide a fourth inductance.

8. The driver of claim 7, further comprising a second driver stage electrically connected to the first driver stage, wherein a first input node of the second driver stage is connected to a node between a first inductor of the first set of inductors and a second inductor of the first set of inductors, and a second input node of the second driver stage is connected to a node between a first inductor of the third set of inductors and a second inductor of the third set of inductors.

9. The driver of claim 7, further comprising:
    a first resistor between a first power voltage and both of the first set of inductors and the second set of inductors; and
    a second resistor between a second power voltage and both of the third set of inductors and the fourth set of inductors.

10. The driver of claim 9, wherein the first power voltage is different from the second power voltage.

11. A driver comprising:
    a first driver stage having a first T-coil structure, wherein the first T-coil structure comprises:
        a first set of inductors each being operable to provide an inductance of about 0.2 nanohenries (nH) or more and a coupling coefficient of about 0.5; and
        a second set of inductors electrically coupled in parallel with the first set of inductors, wherein the second set of inductors each are operable to provide an inductance of about 0.2 nH or more.

12. The driver of claim 11, wherein a first node between a first inductor of the first set of inductors and a second inductor of the first set of inductors is electrically connected to a second node between a first inductor of the second set of inductors and a second inductor of the second set of inductors.

13. The driver of claim 12, further comprising a second driver stage electrically connected to the first driver stage, wherein an input node of the second driver stage is electrically connected to the first node.

14. The driver of claim 13, wherein the second driver stage comprises a plurality of transistors connected in series between a first power voltage and a current source.

15. The driver of claim 14, wherein a gate of a first transistor of the plurality of transistors is electrically connected to the input node, a gate of a second transistor of the plurality of transistors is configured to receive the first power voltage, and a gate of a third transistor of the plurality of transistors is configured to receive a second power voltage.

16. The driver of claim 15, wherein the first power voltage is different from the second power voltage.

17. A driver comprising:
    a first driver stage having T-coil structures, the T-coil structures each comprising:
        a plurality of sets of inductors that are electrically coupled with each other, wherein each set of inductors of the plurality of sets of inductors is operable to provide a coupling coefficient of about 0.5, and a first inductor of a first set of inductors of the plurality of sets of inductors is coupled in parallel with a second inductor of a second set of inductors of the plurality of sets of inductors.

18. The driver of claim 17, wherein the first driver stage further comprises a plurality of transistors, wherein each transistor of the plurality of transistors is electrically connected to a corresponding T-coil structure of the T-coil structures.

19. The driver of claim 18, wherein the first driver stage further comprises a plurality of inductors, wherein each inductor of the plurality of inductors is connected between a transistor of the plurality of transistors and a corresponding T-coil structure of the T-coil structures.

20. The driver of claim 17, wherein the T-coil structures each further comprise a capacitor electrically connected to the plurality of sets of inductors.

\* \* \* \* \*